(12) United States Patent
Gerstmeier et al.

(10) Patent No.: US 7,304,899 B2
(45) Date of Patent: Dec. 4, 2007

(54) INTEGRATED SEMICONDUCTOR MEMORY

(75) Inventors: Günter Gerstmeier, Hilg.-Tandern (DE); Michael Bernhard Sommer, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 246 days.

(21) Appl. No.: 11/234,383

(22) Filed: Sep. 26, 2005

(65) Prior Publication Data

US 2006/0067107 A1 Mar. 30, 2006

(30) Foreign Application Priority Data

Sep. 29, 2004 (DE) ............... 10 2004 047 330

(51) Int. Cl.
*G11C 7/00* (2006.01)
(52) U.S. Cl. ............... 365/200; 365/225.7; 365/239
(58) Field of Classification Search ............... 365/200, 365/225.7, 239
See application file for complete search history.

(56) References Cited

U.S. PATENT DOCUMENTS 6,208,567 B1 * 3/2001 Yamauchi et al. ......... 365/200
6,246,627 B1 * 6/2001 Yamauchi et al. ....... 365/225.7

FOREIGN PATENT DOCUMENTS

DE 3924695 2/1990

* cited by examiner

*Primary Examiner*—Huan Hoang
(74) *Attorney, Agent, or Firm*—Edell, Shapiro & Finnan, LLC

(57) ABSTRACT

An integrated semiconductor memory includes programmable elements, which are arranged in a continuous region on a chip area of the integrated semiconductor memory. Operating parameters, for example, word line addresses of defective word lines are stored in the programmable elements in a compressed data format during the fabrication process of the integrated semiconductor memory. Upon activation of the integrated semiconductor memory, the compressed data are read out by a read-out circuit and fed to a decompression circuit. The decompression circuit generates, from a bit sequence of the compressed data with the aid of a decompression algorithm, a bit sequence of decompressed data which are evaluated by a control circuit. The storage of the operating parameters in the compressed data format and the arrangement of the programmable elements in a compact region significantly reduce the space requirement on the semiconductor chip.

11 Claims, 3 Drawing Sheets

US 7,304,899 B2

INTEGRATED SEMICONDUCTOR MEMORY

CROSS-REFERENCE TO RELATED APPLICATION

This application claims priority under 35 USC §119 to German Application No. DE 102004047330.7, filed on Sep. 29, 2005, and titled "Integrated Semiconductor Memory," the entire contents of which are hereby incorporated by reference.

FIELD OF THE INVENTION

The present invention relates to an integrated semiconductor memory having programmable elements in which operating parameters for operating the integrated semiconductor memory are stored.

BACKGROUND

In integrated semiconductor memories, for example, DRAM (dynamic random access memory) semiconductor memories, operating parameters that determine the operating behavior of the integrated semiconductor memory are partly programmed into the semiconductor memory as early as in the production process. Such operating parameters relate to the setting of voltage values of an internal voltage network, the setting of delay parameters, and principally, also the activation of redundant structures.

FIG. 3 shows an integrated semiconductor memory 100 having a memory cell array 10. Within the memory cell array, memory cells SZ are arranged along word lines WL and bit lines BL. FIG. 3 illustrates in an exemplary manner a DRAM memory cell SZ comprising a selection transistor AT and a storage capacitor SC. In order to write an item of information to the memory cell or in order to read an item of information from the memory cell, the selection transistor AT is turned on by a corresponding control signal on the word line WL so that the storage capacitor SC is conductively connected to the bit line BL.

In the case of reading out an item of memory information, on the bit line BL, there is a potential increase or potential decrease relative to a precharge potential of the bit line, which is detected by a sense amplifier 11 and fed to an output terminal DQ of the integrated semiconductor memory in amplified fashion. When an item of information is read in, the signal level applied to the data terminal DQ is amplified by the sense amplifier 11 and written to the storage capacitor SC of the memory cell SZ via the bit line BL.

For controlling read and write accesses, the integrated semiconductor memory has a control circuit 40 and an address register 50. For selecting one of the memory cells SZ, a word line address X and a bit line address Y are applied to an address terminal A50. A memory cell of the memory cell array 10 is unambiguously identified based on the word and bit line addresses. When a control terminal S40 is driven with a write command WR, the memory cell array 10 is driven by the control circuit 40 such that a datum present at the data terminal DQ is written to the memory cell selected by the word and bit line addresses. If a read command RD is applied to the control circuit 40, the memory cell array 10 is configured by the control circuit 40 such that a memory cell SZ selected by the word line and bit line addresses is read at the data terminal DQ.

In the context of the production process, the memory cells along a word line are subject to extensive functional tests. If it is ascertained that defective memory cells are connected to a word line, or the word line itself has a defect, then the affected word line is generally replaced by a redundant word line WLr. Accordingly, the memory cells SZ connected to the defective word line WL are replaced by redundant memory cells SZr connected along the redundant word line WLR.

If a memory cell arranged along the defective word line is accessed during a read and write access, the control circuit 40 activates the redundant word line WLr, instead of the defective word line. For this purpose, the control circuit 40 must know the word line address X of the defective word line. If, for example, the word line WL is detected as defective in the production process or during subsequent testing, then the word line address X of the defective word line is stored in fuse elements of a fuse bank.

FIG. 3 shows five different fuse banks 21, 22, 23, 24, 25 at the edge of the memory cell array 10. The fuse banks are assigned to redundancy bit or word line decoders. The fuse banks are connected to read-out circuits 31, 32, 33, 34, 35 for the read-out of the respective fuse bank. The word line addresses of defective word lines that are programmed in the fuse banks are converted into a data record comprising a bit sequence B by the read-out circuits and forwarded to the control circuit 40. From activation of the integrated semiconductor memory, the control circuit 40 evaluates the bit sequences from the read-out circuits, so that the control circuit 40 then knows the addresses of the defective word lines.

FIG. 4 shows an enlarged illustration of the fuse bank 21 connected to the read-out circuit 31. The fuse bank 21 includes a plurality of fuse units 210, 220, 230, 240, 250, 260. Each of the fuse units illustrated in FIG. 4 includes fuse elements 0, . . . 7. The fuse elements may be formed as fusible links, for example, which are destroyed during programming in the production process by irradiation with a laser pulse. The respective programming state of the fuse element is detected by the read-out circuit 31. If, for example, when reading the fuse element 0 of the fuse unit 210, the read-out circuit 31 ascertains that the associated fusible link has been destroyed, this corresponds to a programming state "1," for example. If, by contrast, the fusible link of the fuse element 0 has not been destroyed, this programming state corresponds to a logic "0." It is possible, for example, for an address bit of a word line address assigned to a defective word line to be stored in a respective fuse element of a fuse unit. When the fuse unit 210 is read, the read-out circuit thus generates a bit sequence including address bits 0, . . . , 7 of the stored word line address.

Each of the fuse units 210, . . . , 260 illustrated in FIG. 4 is assigned a redundant structure, for example, a redundant word line, by a redundancy bit or word line decoder. For deciding whether a fuse unit contains a valid address of a defective word line, the respective fuse element 0 of a fuse unit is used as a signaling bit. If the fuse element 0 of the fuse unit 210 has the programming state "1", for example, then the programming states of the fuse elements 1, . . . , 7 of the fuse unit 210 specify the address bits of the word line address X of the defective word line, which is replaced by the redundant word line assigned to the fuse unit 210.

The number of fuse elements of a fuse unit is dependent on the address range in which the redundant structure is intended to be used. However, each fuse element requires a considerable proportion of chip area CF. Reducing this proportion of the chip area becomes more desirable, the less the layout of the fuse elements can be reduced in size from memory generation to memory generation. The fuse elements are irradiated with high-energy radiation of a laser during programming. By virtue of the wavelength used, limits are imposed on arbitrarily reducing the size of the fuse elements in the context of scaling of the circuit layout. Relative to the rest of the circuit components, the fuse elements are thus occupying an ever larger space on the semiconductor chip.

The layout of the fuse elements with the associated read-out circuit has hitherto been positioned in proximity to the redundant structure. In order to configure the layout of a fuse bank in a manner as far as possible optimized with respect to area, fuse banks adjacent to one another are combined. The space taken up by necessary safety regions between a fuse bank and other circuit components of the integrated semiconductor memory can be reduced in this way. With dispersed redundant structures on the semiconductor chip, a further minimization of these safety zones is almost no longer possible at the present time.

In the unprogrammed state, the fuse elements of a fuse unit have the logic state "0." Since the word line address X=0000000 of a defective word line cannot be distinguished from this presetting, instead of seven fuse elements, a total of eight fuse elements are used in the exemplary embodiment of FIG. 4. In this case, the fuse element 0, i.e., the master fuse, is no longer part of the word line address, but rather determines whether the redundant structure assigned to the fuse unit 210 is activated. Therefore, it no longer represents an address bit. If the fuse element 0 is programmed with the logic state "1," for example, then the redundant word line assigned to the fuse unit 210, for example, is used instead of the regular word line, the word line address of which is determined by the programming state of the fuse elements 1, . . . , 7. This means that half of all programmable combinations of programming states of the fuse unit 210 are not utilized. Furthermore, at the present time, chip area is wasted, particularly, when the redundant structure is not used at all.

An integrated semiconductor memory in which the number of fuse elements required for programming operating settings of the integrated semiconductor memory is reduced, and a method for operating an integrated semiconductor memory in which the operating settings stored in a reduced number of fuse elements can be evaluated by a control circuit, are desirable.

SUMMARY

An integrated semiconductor memory according to the present invention includes a multiplicity of externally programmable elements, which are irreversibly programmable with a first or second programming state via a production unit during fabrication of the integrated semiconductor memory, and a read-out circuit for reading out the respective programming state of the programmable elements with an output terminal for generating a bit sequence of a first data record. The integrated semiconductor memory according to the invention furthermore includes a decompression circuit with an input terminal for applying the bit sequence of the first data record and with an output terminal for generating a bit sequence of a second data record. The read-out circuit reads out the respective programming state from a respective one of the programmable elements and generates the bit sequence of the first data record at its output terminal in a manner dependent on the respective programming state of the programmable elements which it has read out. The decompression circuit generates the bit sequence of the second data record based on a decompression method, so that the bit sequence of the second data record is longer than the bit sequence of the first data record.

Operating parameters of the integrated semiconductor memory are stored in the programmable elements, for example, in a compressed data format by production units. The programmable elements are read by the read-out circuit when the integrated semiconductor memory is activated. A bit sequence containing the operating parameters in a compressed format is produced. For evaluating the operating parameters, the decompression circuit converts the compressed data stream into a decompressed data record in which, for example, blocks of a plurality of successive bits specify the address bits of a defective word line.

The programmable elements are, for example, formed as fuse elements, that, for example, are programmed by a laser pulse.

In accordance with one implementation of the integrated semiconductor memory, the programmable elements are arranged in a continuous region of a chip area of the integrated semiconductor memory. In this case, the continuous region of the chip area with the programmable elements is arranged at least at a first distance from circuit components of the integrated semiconductor memory. The distance is selected such that the circuit components remain undamaged during programming of the fuse elements by a laser pulse.

In contrast to the use of fuse units assigned to individual redundant structures, the rigid assignment of the fuse elements to the respective redundant structures is obviated according to the invention. The operating parameters are stored in the compressed data format in the fuse elements of the continuous region. The fuse elements of this fuse array are read once, for example, upon initialization of the integrated semiconductor memory, and are then available for further configuration of the integrated semiconductor memory.

In a further embodiment, the integrated semiconductor memory includes a memory cell array with memory cells. The continuous region of the chip area with the programmable elements is at a second, further distance from the memory cell array, than the remaining circuit components of the integrated semiconductor memory.

In the case of the concept according to the invention, the fuse units are arranged in a compact manner and are no longer arranged in a manner dispersed on the chip. With a compact arrangement of the fuse elements in a continuous region, a safety distance from other circuit components needs to be complied with only with respect to this fuse array. No further circuit components are permitted to be arranged within the safety distance. Consequently, fewer "dead regions" in which no components are situated are present on the semiconductor chip, than when fuse banks with respective safety distances from adjacent circuit components are provided in a manner dispersed on the chip area. The continuous fuse array is, for example, positioned at a location on the semiconductor chip at which the destruction of sensitive structures is relatively precluded during the programming of the fuse elements. The circuit layout is facilitated to a considerable extent.

In another aspect, the decompression circuit of the integrated semiconductor memory has a logic circuit. The bit sequence of the first data record is fed to the logic circuit on the input side. The logic circuit generates the bit sequence of the second data record on the output side in the event of driving with the bit sequence of the first data record.

According to a further feature, the logic circuit has a programming terminal for applying a programming signal.

The logic circuit is programmed with a sequence control for decompressing the bit sequence of the first data record by applying the programming signal to the programming terminal.

The decompression algorithm can be adapted, by the use of a programmable logic, to the magnitude of the operating parameters that are to be stored.

A further embodiment provides the integrated semiconductor memory having a control circuit for controlling the integrated semiconductor memory with an input terminal for applying the bit sequence of the second data record. The bit sequence of the second data record is fed to the control circuit from the decompression circuit. Upon initialization of the integrated semiconductor memory for a read and write access, the control circuit evaluates the bit sequence of the second data record from the decompression circuit and configures the integrated semiconductor memory for the read and write access based on the evaluated bit sequence of the second data record.

The fuse array with the programmable elements is, for example, read each time the integrated semiconductor memory is initialized. Therefore, it is no longer necessary to provide, within the fuse array, separately programmable elements that serve as signaling bits for defining whether the redundant structures assigned to the programmable elements are actually used.

In one implementation of the integrated semiconductor memory, the memory cells of the memory cell array are connected to a word line and to a respective bit line. For read and write access to one of the memory cells, the respective word line is selected by a word line address and activated by the control circuit. A redundant one of the word lines is activated by the control circuit in the event of read and write access to one of the memory cells connected to a defective one of the word lines. The bit sequence of the second data record includes a word line address. The control circuit evaluates the word line address in the bit sequence of the second data record and, instead of the word line associated with the word line address, activates the redundant one of the word lines for the read and write access.

A method for operating an integrated semiconductor memory provides for the use of an integrated semiconductor memory with externally programmable elements irreversibly programmable by a production unit during fabrication of the integrated semiconductor memory. During fabrication of the integrated semiconductor memory, operating parameters of the integrated semiconductor memory are stored by a production unit in a compressed data format by programming of the programmable elements. A respective programming state of the programmable elements is read out upon each initialization of the integrated semiconductor memory. A bit sequence of a first data record is generated based on the programming state of the programmable elements that is respectively read out. A bit sequence of a second data record is generated by decompression of the bit sequence of the first data record. A control circuit is driven with the bit sequence of the second data record. The bit sequence of the second data record is subsequently evaluated by the control circuit. The integrated semiconductor memory is subsequently configured for read and write accesses by the control circuit based on the evaluated bit sequence of the second data record.

The method according to the present invention can further include providing the integrated semiconductor memory with a memory cell array, in which memory cells are arranged along word lines and bit lines. The word lines are assigned a word line address by which the respective word line can be selected. Furthermore, a defective one of the word lines is replaced by a redundant one of the word lines. The bit sequence of the second data record includes one of the respective word line addresses. The redundant one of the word lines is activated by the control circuit, if the integrated semiconductor memory is driven by that one of the word line addresses assigned to that one of the defective word lines, and the bit sequence of the second data record includes that one of the word line addresses.

BRIEF DESCRIPTION OF FIGURES

The invention is explained in more detail below with reference to the figures showing exemplary embodiments of the present invention. In the figures.

DETAILED DESCRIPTION

Figure 1:
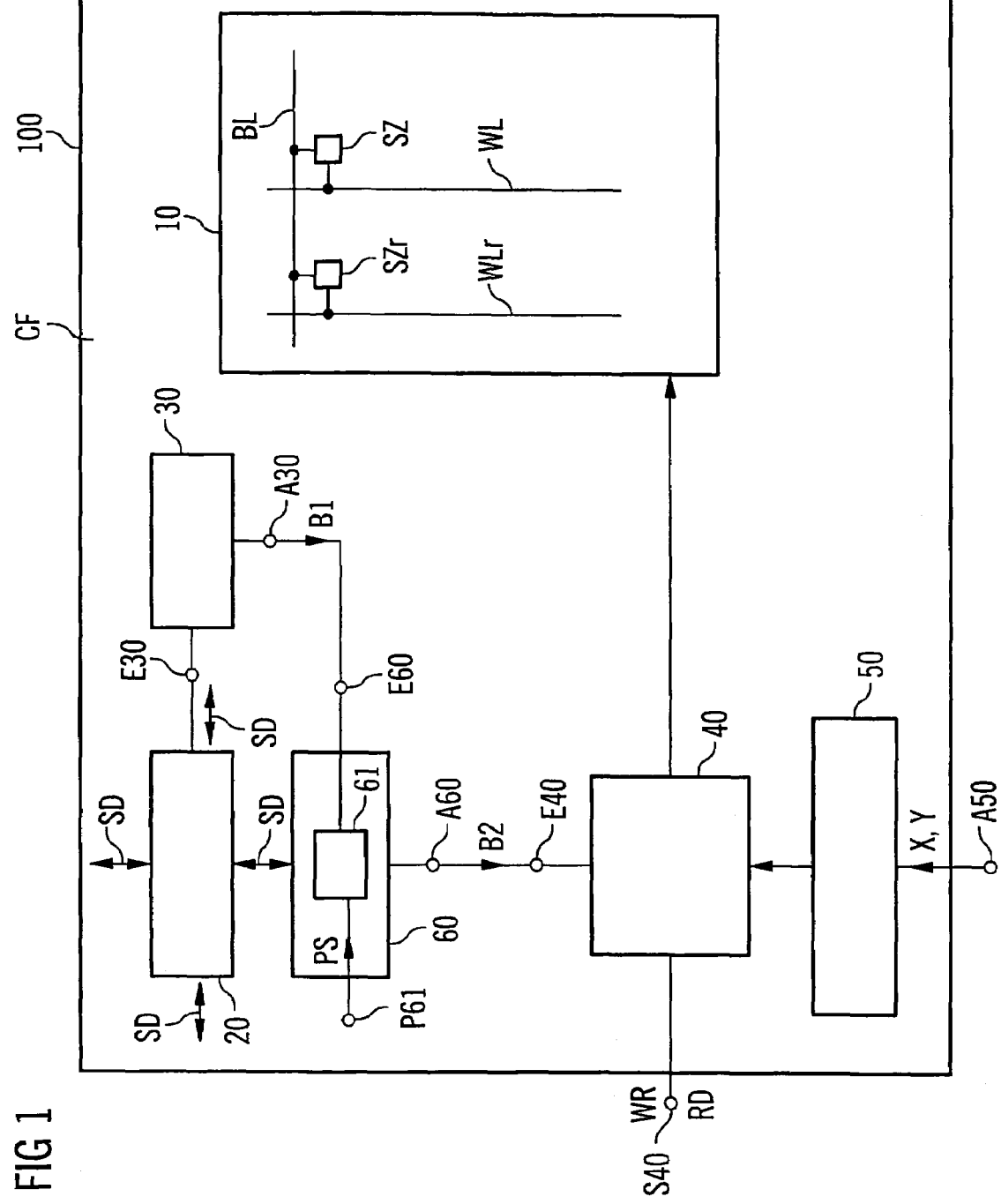
FIG. 1 illustrates an integrated semiconductor memory in which fuse elements are arranged in a continuous region.

FIG. 1 shows an integrated semiconductor memory 100 according to the invention having a memory cell array 10, in which regular memory cells SZ are arranged along word lines WL and bit lines BL. Defective word lines WL are replaced by redundant word lines WLr, to which redundant memory cells SZr are connected. Besides the memory cell array 10, the integrated semiconductor memory 100 has the control circuit 40, already explained with reference to FIG. 3, for controlling a read and write access to the integrated semiconductor memory and the address register 50 for applying word line addresses X and bit line addresses Y.

Figure 3:
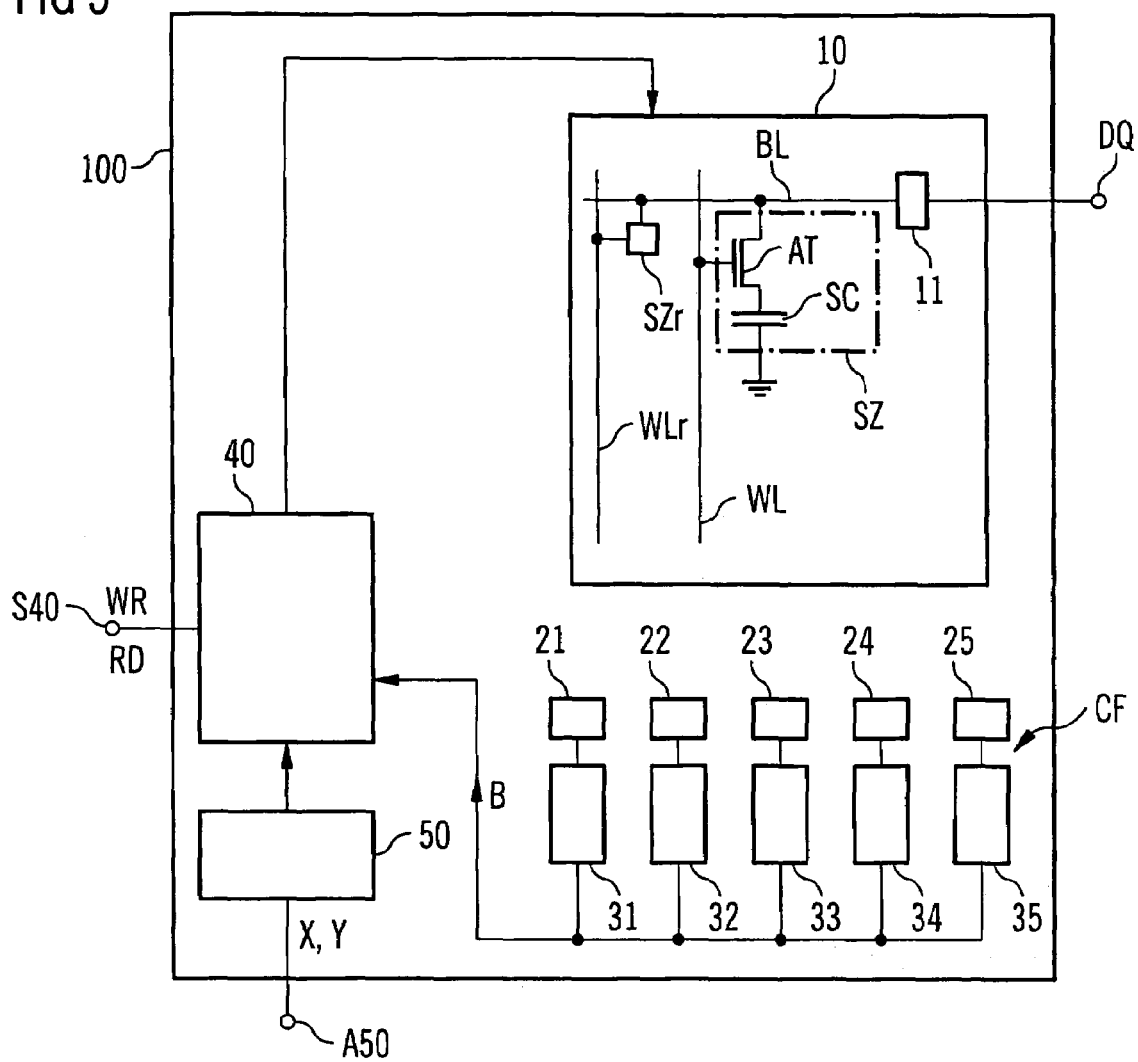
FIG. 3 illustrates an integrated semiconductor memory with fuse banks in accordance with the prior art.
Figure 4:
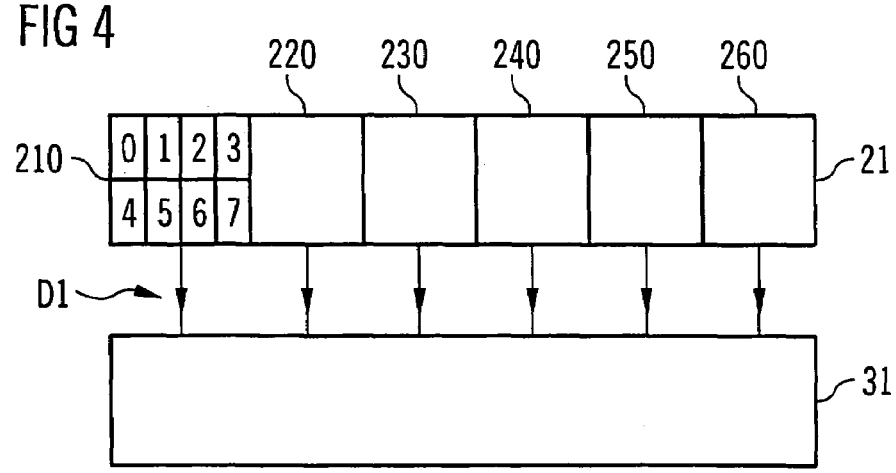
FIG. 4 illustrates a fuse bank with a read-out circuit in accordance with the prior art.

In contrast to the embodiment of FIG. 3, the fuse layout, which in FIG. 3 includes the fuse banks 21, . . . , 25 and the associated read-out circuits 31, . . . 35, is arranged in a continuous region 20. The continuous region 20 including the fuse elements is connected to an input terminal E30 of a read-out circuit 30. An output terminal A30 of the read-out circuit 30 is connected to an input terminal E60 of a decompression circuit 60. The decompression circuit 60 has a logic circuit 61, which is programmed by applying a programming signal PS to a programming terminal P61. An output terminal A60 of the decompression circuit 60 is connected to an input terminal E40 of the control circuit 40.

Figure 2:
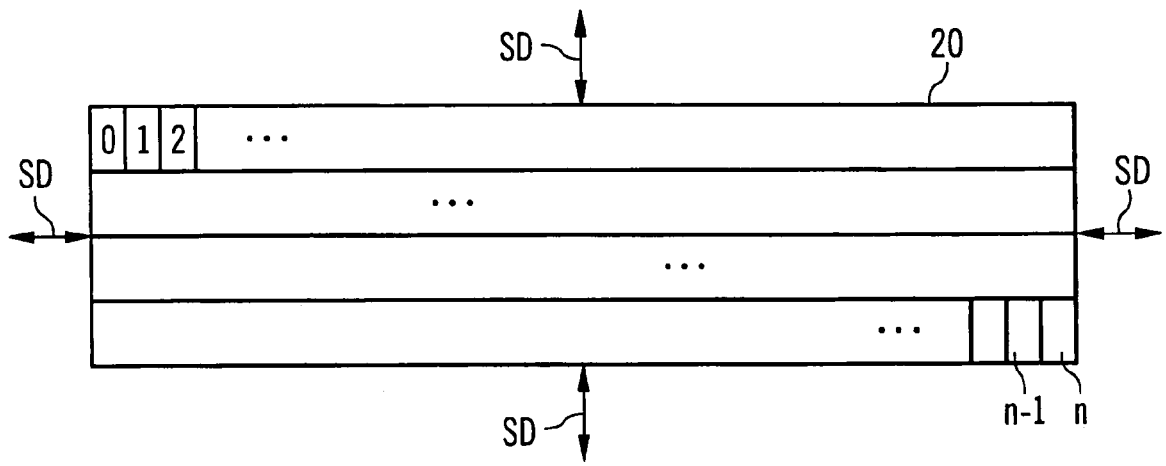
FIG. 2 illustrates a continuous region with fuse elements according to the invention.

FIG. 2 shows an enlarged illustration of the continuous region 20 on the semiconductor chip. The region contains the fuse elements 0, 1, 2 . . . , n–1, n, which are arranged in four rows lying one beneath the other in the exemplary embodiment of FIG. 2. The continuous fuse array 20 is at a safety distance SD from the rest of the circuit components of the integrated semiconductor memory. Since the fuse elements are programmed by a laser pulse with high-energy radiation in the fabrication process, the safety distance SD is selected such that the remaining structures of the integrated semiconductor memory are not damaged by the high-energy radiation. Therefore, it is recommended, in particular, that the continuous fuse array 20 be positioned at a location on the semiconductor chip that is as far away from the memory cell array 10 as possible.

In contrast to the embodiment of FIG. 3, the fuse array no longer includes individual fuse units assigned to redundant structures, but rather fuse elements arranged successively in one or more rows. For example, the addresses of the defective word lines to be replaced by redundant word lines are written to the fuse array in a compressed data format. For example, the addresses of defective word lines are collected in the production units of a fabrication line. The address bits of the word line addresses of defective word lines form a bit sequence, which are compressed in the production units to form a compressed bit sequence of a first data record.

Data compression algorithms are used for compressing the address bits. In a simple embodiment, the number of bit states "0" and "1" lying one after another in a bit sequence is evaluated and stored in coded fashion. However, it is also possible to use commercial data compression algorithms, such as, for example, the ZIP algorithm that is used in many cases for software compression.

The word line addresses of defective word lines correspond, after a corresponding data compression, to a bit sequence of a first data record B1 that is programmed into the fuse array 20 by the production unit, in which the corresponding fuse elements that each represent a bit of the compressed bit sequence are destroyed or remain in the undestroyed state. Upon initialization of the semiconductor memory, the programming states of the fuse elements of the fuse array 20 are read out by the read-out circuit 30. At its output terminal A30, the read-out circuit 30 generates the compressed bit sequence of the first data record B1, which contains the word line addresses of the defective word lines in a compressed data format.

The compressed data format cannot yet be directly evaluated by the control circuit 40. The compressed bit sequence is therefore fed to the input terminal E60 of the decompression circuit 60. The decompression circuit 60 includes a logic circuit 61 that performs a decompression of the bit sequence B1. The logic circuit 61 generates a decompressed bit sequence of a second data record B2 at its output terminal A60, after the decompression of the bit sequence B1 of the first data record that is fed to it. The bit sequence of the decompressed second data record is longer than the bit sequence of the compressed first data record. Each bit of the decompressed bit sequence B2 corresponds to an address bit of a word line address of a defective word line WL. The decompressed bit sequence B2 thus contains the sequence of address bits that was stored in the fuse elements 1, ..., 7 of the fuse units 210, ..., 260 of the fuse bank 21 of the original fuse layout.

The logic circuit 61 that performs the decompression of the bit sequence B1 includes the decompression algorithm associated with the compression algorithm used in the production unit. The decompression algorithm may be implemented either as hardware or software. In the case of the software implementation, the decompression algorithm is written to the logic circuit 61, which is formed as a programmable logic, for example, by the programming signal PS.

By virtue of writing the operating settings, for example, the addresses of defective word lines to be replaced by redundant word lines, to the fuse elements of the fuse array 20 in the compressed data format, the number of fuse elements required can be relatively reduced in comparison with the number of fuse elements required, if each fuse element represents an individual address bit of a word line address. Reducing the absolute number of fuses also reduces the probability of an incorrect read-out.

The fuse units of the fuse banks have been directly assigned to individual redundant structures. The fuse banks were arranged together on the semiconductor chip with their respective read-out circuits in proximity to the redundant structures. The use of a continuous layout region in which the fuse elements are arranged permits the break-up of the hitherto rigid fuse assignment to their redundant structures. The fuse elements thus no longer need be arranged in proximity to the associated redundant structure.

The continuous fuse array is arranged at a location of the integrated semiconductor memory far away from sensitive structures, for example, the memory cells of the memory cell array, which may be destroyed during the programming of the fuse elements.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

| List of reference symbols | |
|---|---|
| 10 | Memory cell array |
| 20 | Continuous region (fuse array) with fuse elements |
| 21, ..., 25 | Fuse banks |
| 30 | Read-out circuit |
| 40 | Control circuit |
| 50 | Address register |
| 60 | Decompression circuit |
| 61 | Logic circuit |
| 210, ..., 260 | Fuse units |
| A | Output terminal |
| B | Bit sequence |
| BL | Bit line |
| D | Data record |
| E | Input terminal |
| P | Programming terminal |
| PS | Programming signal |
| RD | Read signal |
| S | Control terminal |
| SD | Safety distance |
| SZ | Memory cell |
| SZr | Redundant memory cell |
| WL | Word line |
| WLr | Redundant word line |
| WR | Write signal |
| X | Word line address |
| Y | Bit line address |

What is claimed:

1. An integrated semiconductor memory, comprising:
   a multiplicity of externally programmable elements irreversibly programmable with a first or second programming state via a production unit during fabrication of the integrated semiconductor memory;
   a read-out circuit for reading out the respective programming state of the programmable elements with an output terminal for generating a bit sequence of a first data record, wherein the read-out circuit reads out the respective programming state from a respective one of the programmable elements and generates the bit sequence of the first data record at the output terminal depending upon the respective programming state of the programmable elements; and
   a decompression circuit with an input terminal for applying the bit sequence of the first data record and an output terminal for generating a bit sequence of a second data record, wherein the decompression circuit generates the bit sequence of the second data record based on a decompression method, so that the bit sequence of the second data record is longer than the bit sequence of the first data record.

2. The integrated semiconductor memory as claimed in claim 1, wherein the programmable elements are arranged in a continuous region of a chip area of the integrated semiconductor memory, the continuous region of the chip area with the programmable elements being arranged at least at a first distance from circuit components of the integrated semiconductor memory, the first distance selected such that the circuit components remain undamaged during programming of fuse elements by a laser pulse.

3. The integrated semiconductor memory as claimed in claim 2, further comprising:

a memory cell array having memory cells, wherein the continuous region of the chip area with the programmable elements is at a second distance from the memory cell array than the remaining circuit components of the integrated semiconductor memory.

4. The integrated semiconductor memory as claimed in claim 1, wherein the programmable elements are fuse elements.

5. The integrated semiconductor memory as claimed in claim 4, wherein the fuse elements are programmed by a laser pulse.

6. The integrated semiconductor memory as claimed in claim 1, wherein the decompression circuit has a logic circuit,
the bit sequence of the first data record is fed to the logic circuit on the input side, and
the logic circuit generates the bit sequence of the second data record on the output side in the event of driving with the bit sequence of the first data record.

7. The integrated semiconductor memory as claimed in claim 6, wherein the logic circuit has a programming terminal for applying a programming signal, the logic circuit being programmed with a sequence control for decompression of the bit sequence of the first data record by applying the programming signal to the programming terminal.

8. The integrated semiconductor memory as claimed in claim 1, further comprising:

a control circuit for controlling the integrated semiconductor memory with an input terminal for applying the bit sequence of the second data record, wherein
the bit sequence of the second data record is fed to the control circuit from the decompression circuit, and
upon initialization of the integrated semiconductor memory for a read and write access, the control circuit evaluates the bit sequence of the second data record from the decompression circuit and configures the integrated semiconductor memory for the read and write access based on the evaluated bit sequence of the second data record.

9. The integrated semiconductor memory as claimed in claim 1, wherein memory cells of a memory cell array are connected to a word line and to a respective bit line,
for read and write access to one of the memory cells, the respective word line is selected by a word line address and activated by a control circuit,
a redundant one of the word lines is activated by the control circuit in the event of read and write access to one of the memory cells connected to a defective one of the word lines,
the bit sequence of the second data record has a word line address, and
the control circuit evaluates the word line address in the bit sequence of the second data record and, instead of the word line associated with the word line address, activates the redundant one of the word lines for the read and write access.

10. A method for operating an integrated semiconductor memory, comprising:

providing an integrated semiconductor memory having externally programmable elements irreversibly programmable by a production unit during fabrication of the integrated semiconductor memory;
storing operating parameters of the integrated semiconductor memory in a compressed data format by programming of the programmable elements by the production unit during fabrication of the integrated semiconductor memory;
reading-out a respective programming state of the programmable elements upon each initialization of the integrated semiconductor memory;
generating a bit sequence of a first data record based on the programming state of the programmable elements respectively read out;
generating a bit sequence of a second data record by decompression of the bit sequence of the first data record;
driving a control circuit with the bit sequence of the second data record;
evaluating the bit sequence of the second data record by the control circuit; and
configuring the integrated semiconductor memory for read and write accesses by the control circuit based on the evaluated bit sequence of the second data record.

11. The method for operating the integrated semiconductor memory as claimed in claim 10, further comprising:

providing the integrated semiconductor memory with a memory cell array, the memory cells each being arranged along word lines and bit lines, the word lines each assigned a word line address by which the respective word line is selected and a defective one of the word lines is replaced by a redundant one of the word lines, wherein the bit sequence of the second data record includes one of the respective word line addresses; and
activating the redundant one of the word lines by the control circuit, if the integrated semiconductor memory is driven by that one of the word line addresses assigned to that one of the defective word lines, and the bit sequence of the second data record includes that one of the word line addresses.

* * * * *